United States Patent
Cantell et al.

(10) Patent No.: US 6,541,336 B1
(45) Date of Patent: Apr. 1, 2003

(54) METHOD OF FABRICATING A BIPOLAR TRANSISTOR HAVING A REALIGNED EMITTER

(75) Inventors: Marc W. Cantell, Sheldon, VT (US); Rajesh Chopdekar, Edison, NY (US); Peter J. Geiss, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/147,248

(22) Filed: May 15, 2002

(51) Int. Cl.[7] .................. H01L 21/8042; H01L 21/4763
(52) U.S. Cl. ................. 438/250; 438/251; 438/253; 438/589
(58) Field of Search .................. 257/587, 593, 257/592, 198, 77, 197, 19; 438/253, 250, 251, 255, 381, 393, 395, 399, 422, 589, 409, 408

(56) References Cited

U.S. PATENT DOCUMENTS

| | | | | |
|---|---|---|---|---|
| 4,567,645 A | * | 2/1986 | Cavanagh et al. | 438/370 |
| 5,986,326 A | * | 11/1999 | Kato | 257/593 |
| 6,020,250 A | * | 2/2000 | Kenney | 438/422 |
| 6,049,098 A | * | 4/2000 | Sato | 257/198 |
| 6,093,243 A | * | 7/2000 | Okada et al. | 117/8 |
| 6,245,619 B1 | | 6/2001 | Boyd et al. | |
| 6,258,679 B1 | | 7/2001 | Burns et al. | |
| 6,271,094 B1 | | 8/2001 | Boyd et al. | |
| 6,299,724 B1 | | 10/2001 | Fayfield et al. | |

FOREIGN PATENT DOCUMENTS

| | | |
|---|---|---|
| JP | 5006995 | 1/1993 |
| JP | 5259103 | 10/1993 |

* cited by examiner

Primary Examiner—Michael S. Lebentritt
(74) Attorney, Agent, or Firm—Schmeiser, Olsen & Watts; William D. Sabo

(57) ABSTRACT

A method of fabricating a bipolar transistor. The method comprising: forming an emitter opening in a dielectric layer to expose a surface of a base layer; performing a clean of the exposed surface, the clean removing any oxide present on the surface and passivating the surface to inhibit oxide growth; and forming an emitter layer on the surface after the performing a clean.

23 Claims, 8 Drawing Sheets

METHOD OF FABRICATING A BIPOLAR TRANSISTOR HAVING A REALIGNED EMITTER

FIELD OF THE INVENTION

The present invention relates to the field of semiconductor device fabrication; more specifically, it relates to a method of fabricating a bipolar transistor having a realigned emitter.

BACKGROUND OF THE INVENTION

Bipolar transistors and especially SiGe bipolar transistors are growing in importance in the electronics industry because of their very high performance. However, fabrication of bipolar transistors presents some challenges especially in the fabrication of bipolar transistors having realigned emitters. A key problem in fabrication of bipolar transistors having realigned emitters is the elimination of native oxide layers formed in emitter openings prior to deposition of the emitter layer. Native oxides are thin oxide layers that grow at room temperature on freshly formed or freshly cleaned silicon surfaces upon exposure to oxygen in the air.

One obvious approach to the problem of native oxide growth in the emitter opening is to severely restrict the time delay allowed between pre-epitaxial cleaning processes and epitaxial growth to a preset range. This adds significant costs in logistics and scrap when the time window is exceeded and the time range leads to variations in performance from lot to lot because the native oxide is still present in a range of thicknesses and continuity.

Therefore, there is a need in the industry for a method to reduce the cost of logistics and scrap when the time window is exceeded and when the time range leads to variations in performance from lot to lot because of the native oxide growth.

SUMMARY OF THE INVENTION

A first aspect of the present invention is a method of fabricating a bipolar transistor, comprising: forming an emitter opening in a dielectric layer to expose a surface of a base layer; performing a clean of the exposed surface, the clean removing any oxide present on the surface and passivating the surface to inhibit oxide growth; and forming an emitter layer on the surface after performing a clean.

A second aspect of the present invention is a method of fabricating a bipolar transistor comprising; providing a substrate; forming a collector in the substrate; forming a base layer over the collector, the base layer including an intrinsic base region, the intrinsic base region including a SiGe layer; forming a dielectric layer over the intrinsic base region; forming an emitter opening in the dielectric layer to expose a surface of the intrinsic base region; and performing a clean of the exposed surface, the clean removing any oxide present on the surface and passivating the surface to inhibit oxide growth; and forming an emitter layer on the surface after the performing a clean.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present disclosure, the terms single-crystal (silicon) and epitaxial (silicon) define essentially the same material as layers of single crystal silicon are commonly fabricated by epitaxial growth, deposition or realignment processes on top of silicon having a regular and repeating crystal structure.

Figure 1:
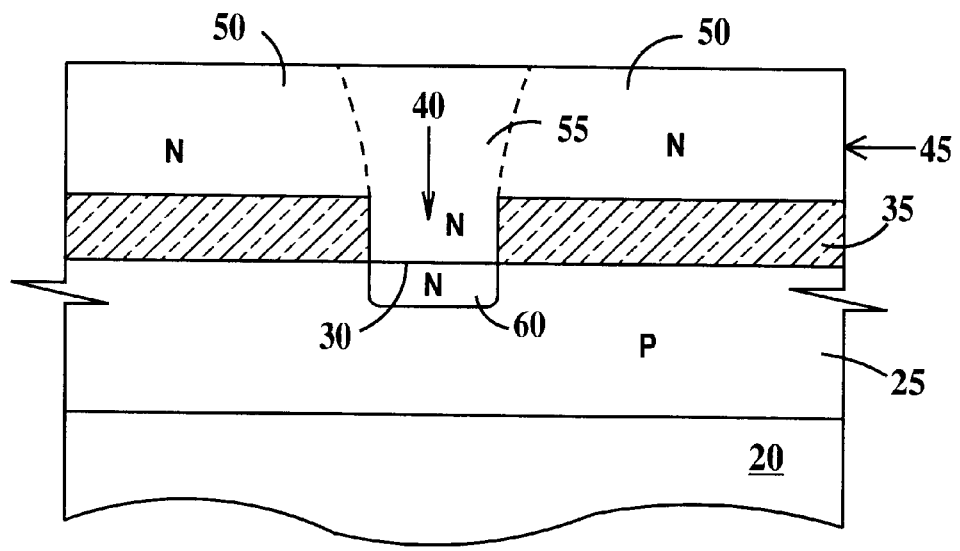
FIG. 1 is a partial cross-sectional view illustrating a realigned emitter.
Figure 2:
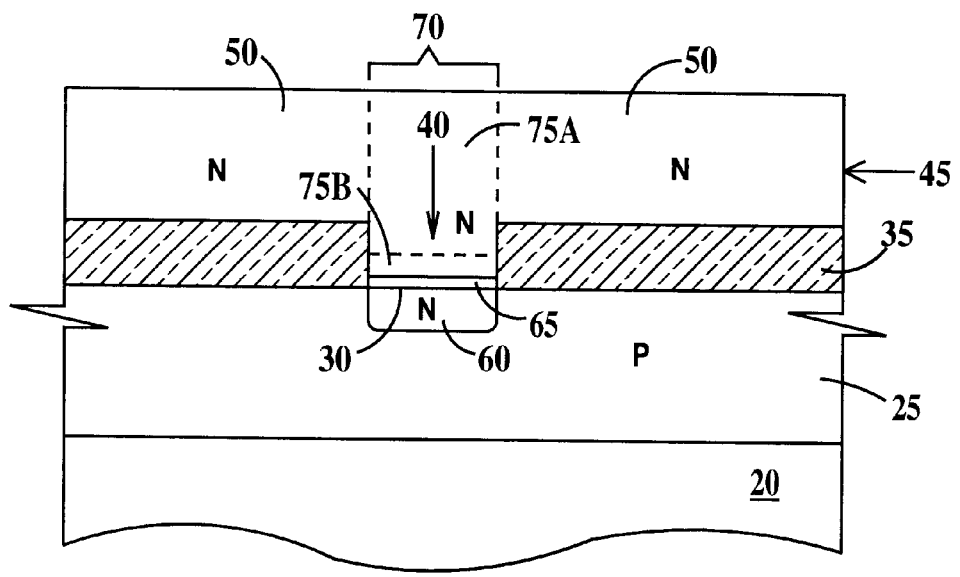
FIG. 2 is a partial cross-sectional view illustrating the effect of native oxide growth on the emitter of FIG. 1.

The effects of native oxide formation on bipolar transistor fabrication may be more fully understood by reference to FIGS. 1 and 2.

FIG. 1 is a partial cross-sectional view illustrating a realigned emitter. In FIG. 1, formed on a silicon substrate 20 is an epitaxial silicon base 25 having a top surface 30. Formed on top surface 30 of silicon base layer 25 is a dielectric layer 35. An emitter opening 40 is formed in dielectric layer 35 exposing top surface 30 of base layer 25. An emitter layer 45 is formed over dielectric layer 35 and top surface 30 of base layer 25 in emitter opening 40. Emitter layer 45 has a polysilicon region 50 over dielectric layer 35 and an epitaxial region 55 over emitter opening 40, the epitaxial region extending down to top surface 40. An emitter 60 is formed in base layer 25. Base region 25 is doped P type and polysilicon region 50 and epitaxial region 55 of emitter layer 45 and emitter 60 are doped N type, the dopant generally including arsenic.

In realigned emitter devices, emitter layer 45 is generally formed by a doped chemical vapor (CVD) process. Single crystal (or epitaxial) silicon is formed when silicon is deposited on single-crystal silicon. Polysilicon silicon is formed when silicon is deposited on a dielectric layer such as silicon oxide. An anneal step is used to drive the dopant from epitaxial region 55 into emitter 30. Because epitaxial region 55 is essentially single crystal silicon the diffusion rate of arsenic is about 10 to 100 times slower than in polysilicon regions 50. Therefore, while dopant buildup may occur at the polysilicon/dielectric interface, no such buildup occurs at the epitaxial region/emitter interface and the dopant.

FIG. 2 is a partial cross-sectional view illustrating the effect of native oxide growth on the emitter of FIG. 1 In FIG. 2, an thin oxide layer 65 of from about 2–3 Å of native oxide (which may form immediately upon exposure of top surface 30 to oxygen) to 5 to 20 Å of native oxide (which may form within a 1 to 24 hours of continuing exposure of top silicon surface 30 to oxygen) has been formed on top surface 60 of base layer 25 in emitter opening 40 prior to formation of emitter layer 45. The presence of thin oxide layer 65 leads to the formation of mixed region 70 over emitter opening 40 extending down thin oxide layer 65. Mixed region 70 includes an upper contact region 75A (where the emitter contact to the device will be formed) and a lower interface region 75B, the interface region in contact with thin dielectric layer 65. Mixed region 70 may range from a partially realigned region to a polysilicon region depending upon the thickness and continuity of thin oxide layer 65. Because of the difference in diffusion rate of arsenic in polysilicon and epitaxial silicon, discussed above, contact region 75A is partially depleted of arsenic and interface region 75B has enhanced levels of arsenic. The combination of a depleted contact region 75A and the presence of thin oxide layer 65 increases the resistance of emitter layer 45.

Figure 3:
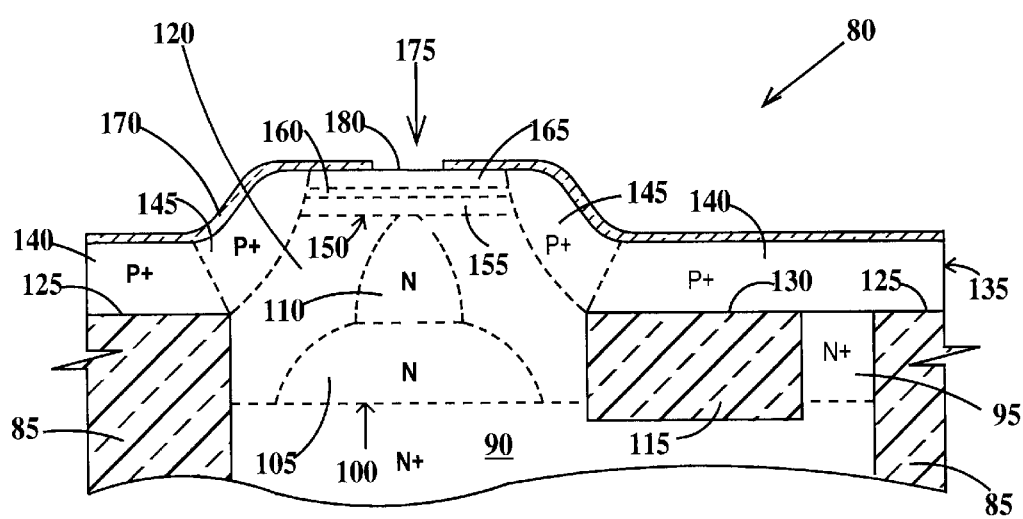
FIGS. 3 through 7 are partial cross-sectional views illustrating fabrication of a bipolar transistor having a realigned emitter according to the present invention.

FIGS. 3 through 7 are partial cross-sectional views illustrating fabrication of a bipolar transistor having a realigned emitter according to the present invention. In FIG. 3, partially formed bipolar transistor 80 includes deep trench isolation 85 surrounding an N+ subcollector 90. An N+ subcollector reach-through 95 contacts subcollector 90. A collector region 100 includes an N+ deep collector 105 on top of subcollector 90 and an N+ pedestal collector 110 on top of deep collector 105. Shallow trench isolation 115 separates collector region 100 from collector reach-through 95. An upper portion 120 of collector region 100 extends above a top surface 125 of deep trench isolation 85 and a top surface 130 of shallow trench isolation 115. Pedestal collector 110 extends into upper portion 120 of collector region 100.

A base layer 135 overlays and contacts deep trench isolation 85, upper portion 120 of collection region 100, shallow trench isolation 115 and collector reach through 95. Base layer 135 includes P+ polysilicon extrinsic base portions 140 contacting deep and shallow trench isolations 85 and 115 and N+ subcollector reach-through 95. Base layer 135 also includes P+ single-crystal extrinsic base portions 145 contacting upper portion 120 of collector region 100. Base layer 135 further includes a single-crystal intrinsic base portion 150, contacting pedestal collector 110 between single P+ single-crystal extrinsic-base portions 145.

Intrinsic base portion 150 of base layer 135 includes a SiGe layer 155 contacting pedestal collector 110, a boron doped SiGe layer 160 on top of SiGe layer 155 and a silicon layer 165 on top of boron doped SiGe layer 160.

A first dielectric layer 170 extends on top of base layer 135. An emitter opening 175 is formed in dielectric layer 170 over intrinsic base portion 150 of base layer 135.

Figure 4:
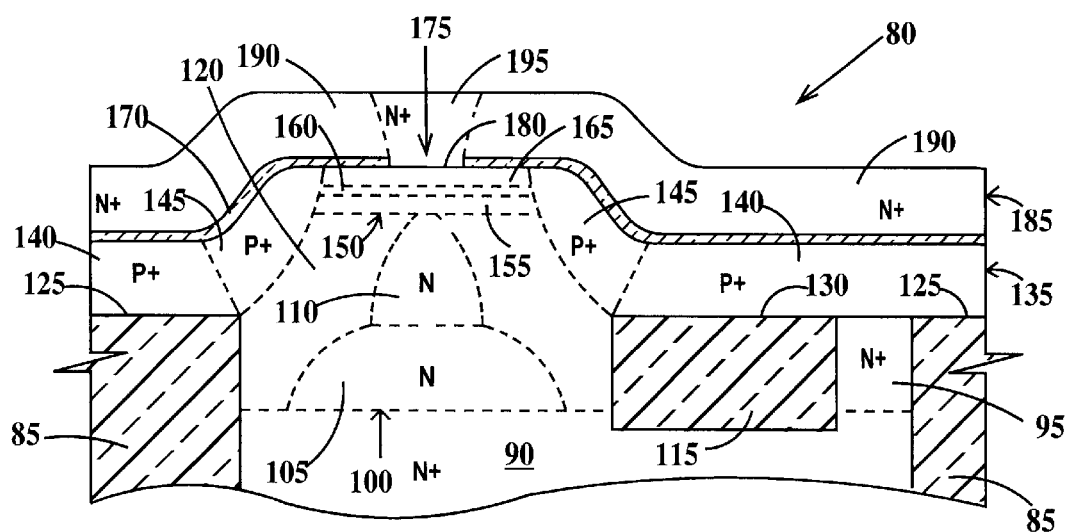

In FIG. 4, a clean has been performed to remove any native oxide that may have been formed on top surface 180 of base layer 135 in emitter opening 175. The clean is a chemical oxide removal (COR) clean. The COR clean is a vapor phase chemical oxide removal process wherein a vapor of HF and $NH_3$ is employed as the etchant and low pressures (6 millitorr or below) are used. COR is a two-step process. The first step of COR may be run in an AMAT 5000 tool manufactured by AME Corp of Santa Clara, Calif., using a mixture of $NH_3$ at a flow rate of about 1 to 35 sccm and HF vapor at a flow rate of about 0 to 100 sccm, a pressure of 2 to 100 millitorr and a temperature of about 15 to 35° C. In the first step a self-passivating oxide layer and an ammonium flouride by-product are formed. The second step of COR is about a 100° C. insitu thermal desorption anneal if desired. The first and second steps are repeated as many times are required to remove the desired thickness of oxide. In one example, the COR process is run for about 10 to 60 seconds and repeated about 2 to 10 times. The COR clean not only removes native oxide but provides a passivated surface that inhibits native oxide growth on the COR cleaned surface.

After the COR clean, a doped polysilicon emitter layer 185 is formed on top of first dielectric layer 170 and top surface 180 of silicon layer 165. The delay between the COR clean and the doped polysilicon emitter deposition may extend to 24 hours or more. In one example, doped polysilicon emitter layer is doped to a concentration of about 5E20 to 2E21 atm/cm$^3$. Two methods of polysilicon deposition may be used. A first method of polysilicon deposition employs a rapid thermal chemical vapor deposition (RTCVD) process using a mixture of $SiH_4$ and $AsH_3$ at a temperature of between about 540 to 640° C. in an AMAT Centura tool manufactured by AME Corp of Santa Clara, Calif. In one example, an RTCVD processes is employed and the deposition time is about 1 to 3 minutes and the deposition rate is about 100 Å per minute or more. A second method of polysilicon deposition employs a low temperature epitaxial (LTE) process. LTE processes are generally long processes and could take up to six hours to deposit a 1600 Å thick polysilicon layer. An example of an LTE tool is a CBOLD Sirus manufactured by the CBOLD Corporation of Germany.

Polysilicon emitter layer 185 is 1000 to 2200 Å thick. Polysilicon layer includes polysilicon regions 190 and a realigned region 195. Realigned region 195 is essentially single crystal silicon, but may include substantial levels of defects such as twins and staking faults, especially if produced using a RTCVD process.

Figure 5:
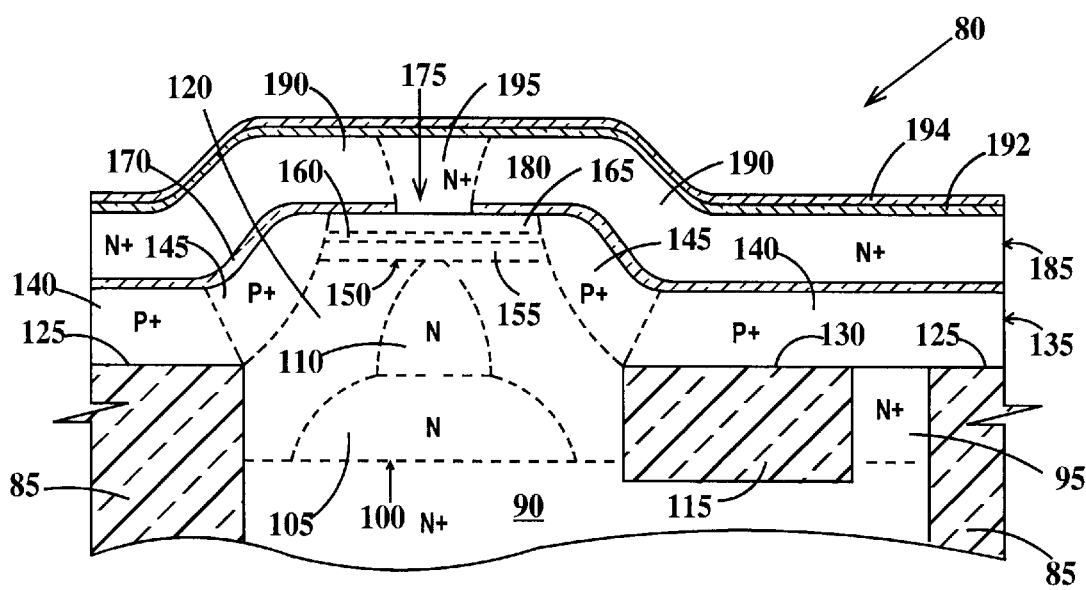

In FIG. 5, a second dielectric layer 192 is formed on polysilicon emitter layer 185 and a third dielectric layer 194 formed on top of the second dielectric layer. In one example, first dielectric layer 192 is 100 to 140 Å of plasma enhanced chemical vapor deposition (PECVD) silicon nitride and second dielectric layer 194 is 1500 to 1900 Å of PECVD silicon nitride.

Figure 6:
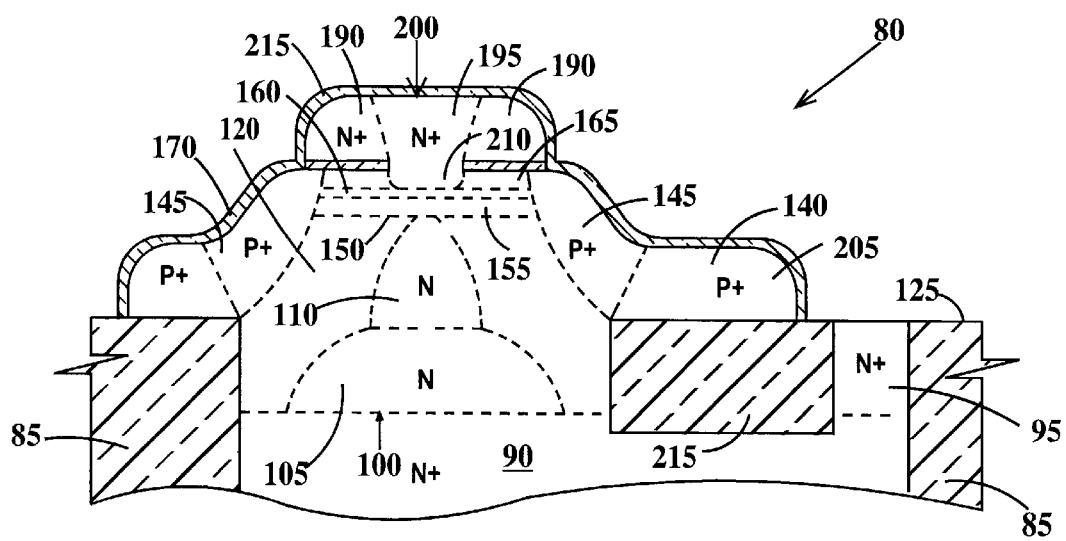

In FIG. 6, polysilicon emitter layer 185 (see FIG. 5) is patterned to form polysilicon emitter 200, and base layer 135 (see FIG. 5) is patterned to form base 205. A fourth dielectric layer 215 is formed on polysilicon emitter 200. An annealing step is performed to drive dopant (arsenic) from realigned region 195 into form single-crystal emitter 210 in silicon layer 165. In one example, the anneal is an rapid thermal anneal (RTA) for 5 seconds at 800 to 1000° C. and fourth dielectric layer is about 100 Å of PECVD silicon nitride.

Figure 7:
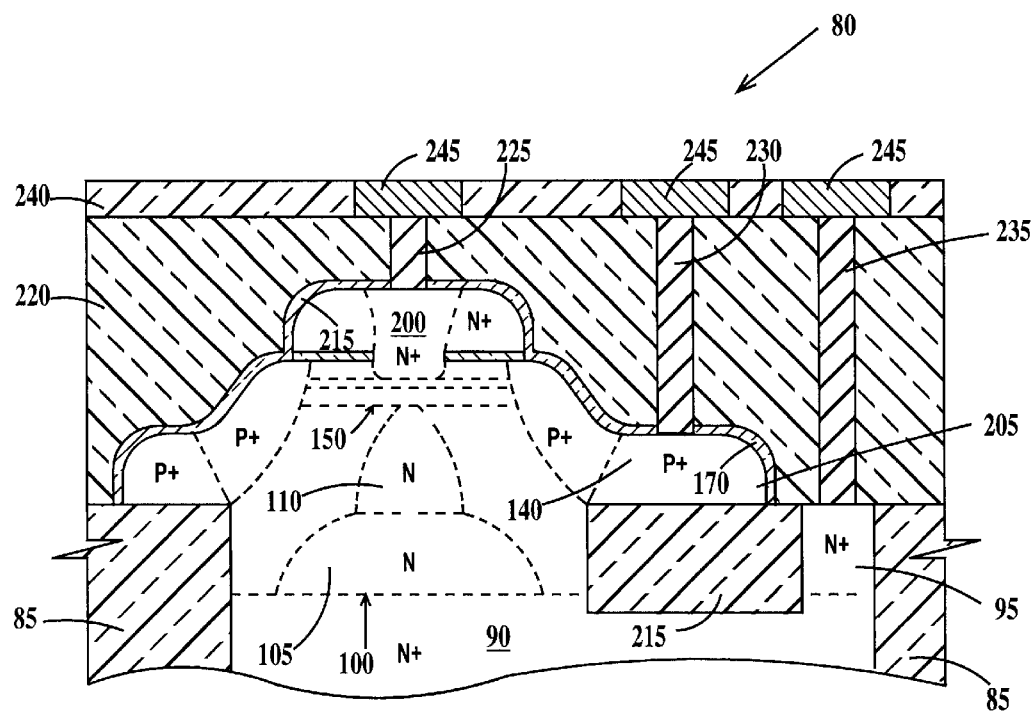

In FIG. 7, a fifth dielectric layer 220 is formed over entire device 80 (see FIG. 6). An emitter contact 225 is formed in fifth dielectric layer 220 through fourth dielectric layer 215 to contact polysilicon emitter 200. A base contact. 230 is formed in fifth dielectric layer 220 through first dielectric layer 170 to contact extrinsic base portion 140 of base 205. A collector contact 235 is formed in fifth dielectric layer 220 through to contact emitter reach through 95. An interlevel dielectric layer 240 is formed over fifth dielectric layer 220 and first metal conductors 245 are formed in the interlevel dielectric layer contacting emitter contact 225, base contact 230 and collector contact 235.

In one example fifth dielectric layer 220 is borophosphorus-silicon glass (BPSG) formed by PECVDI interlevel dielectric layer 240 is tetraethoxysilane (TEOS) oxide formed by PECVD, contacts 225, 230 and 235 are formed from tungsten by well known damascene processes and first metal conductors 245 are formed from aluminum, titanium or copper by well known damascene processes. Metal silicide may be formed at the contact silicon interfaces. Fabrication of bipolar transistor 80 is essentially complete.

Figure 8:
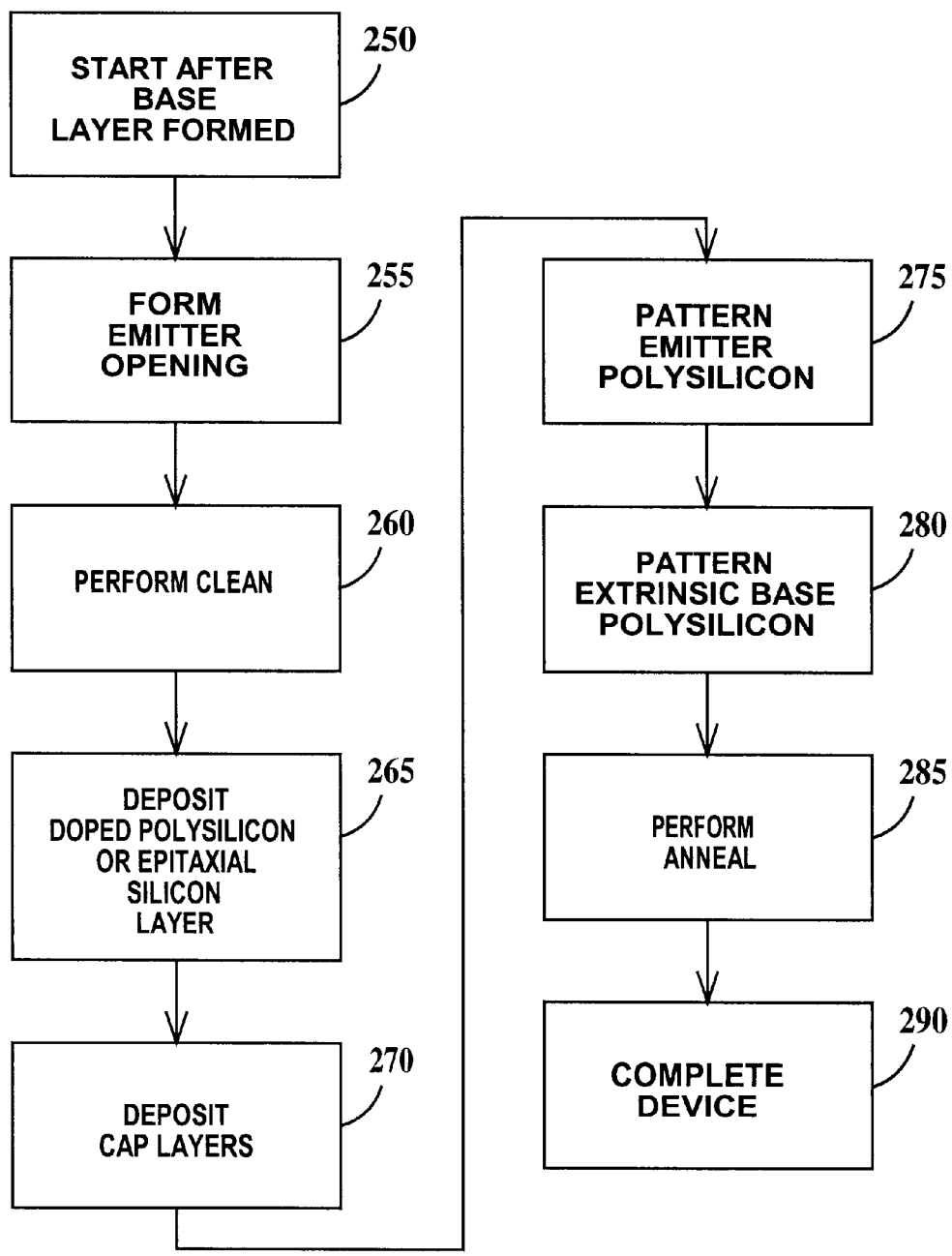
FIG. 8 is a flowchart illustrating fabrication of a bipolar transistor having a realigned emitter according to the present invention.

FIG. 8 is a flowchart illustrating fabrication of a bipolar transistor having a realigned emitter according to the present invention. In step 250, normal processing is performed in the fabrication of a bipolar transistor up to and including formation of the intrinsic and extrinsic base layers and a dielectric layer over the base layers as illustrated in FIG. 3 and described above. Note, the base layer has been patterned and are blanket layers at this point in the fabrication process. Also, the base layer has a polysilicon portion and a single-crystal portion.

In step 255, an emitter opening is formed in the dielectric layer over the intrinsic base region. This may be a reactive ion etch (RIE) process.

In step 260, a COR clean is performed. The COR clean removes any native oxide that has formed on the surface of exposed base layer silicon in the emitter opening and appears to inhibit growth of native oxide for at least 24 to 48 hours. The COR process is described above in reference to FIG. 4. Up to 48 hours may elapse between the performance of step 260 and the subsequent step 265.

In step 265, a doped polysilicon layer is deposited that will form a portion of the emitter of the bipolar transistor. In one example the polysilicon layer is 1000 to 2200 Å thick and doped with arsenic to a concentration of 5E20 to 2E21 atm/cm$^3$. The polysilicon deposition process is described above in reference to FIG. 4. Because of the COR clean, the silicon in the emitter layer in contact with the COR cleaned exposed base layer silicon surface realigns to a single crystal state. This realignment occurs even at polysilicon deposition rates in excess of 100 Å a minute. Alternatively, a doped epitaxial layer may be grown. Polysilicon will form over dielectric materials and epitaxial (single crystal) silicon over single crystal silicon (i.e. the epitaxial base).

In step 270, first and second cap layers are formed on over the polysilicon emitter layer. In one example, the first cap layer is 100 to 140 Å of plasma enhanced chemical vapor deposition (PECVD) silicon nitride and second cap layer is 1500 to 1900 Å of PECVD silicon nitride.

In step 275, the polysilicon emitter layer is patterned to form the polysilicon portion of the emitter of the bipolar transistor by any one of well known photolithographic and RIE techniques.

In step 280, the base layer is patterned to form the base of the bipolar transistor by any one of well known photolithographic and RIE techniques.

In step 285, an anneal is performed to drive the arsenic into the single-crystal portion of the base to form the single-crystal emitter of the bipolar transistor. In one example, the second anneal is an RTA for 5 seconds at 800 to 1000° C.

In step 290, the bipolar transistor is completed as illustrated in FIG.7 and described above.

Figure 9:
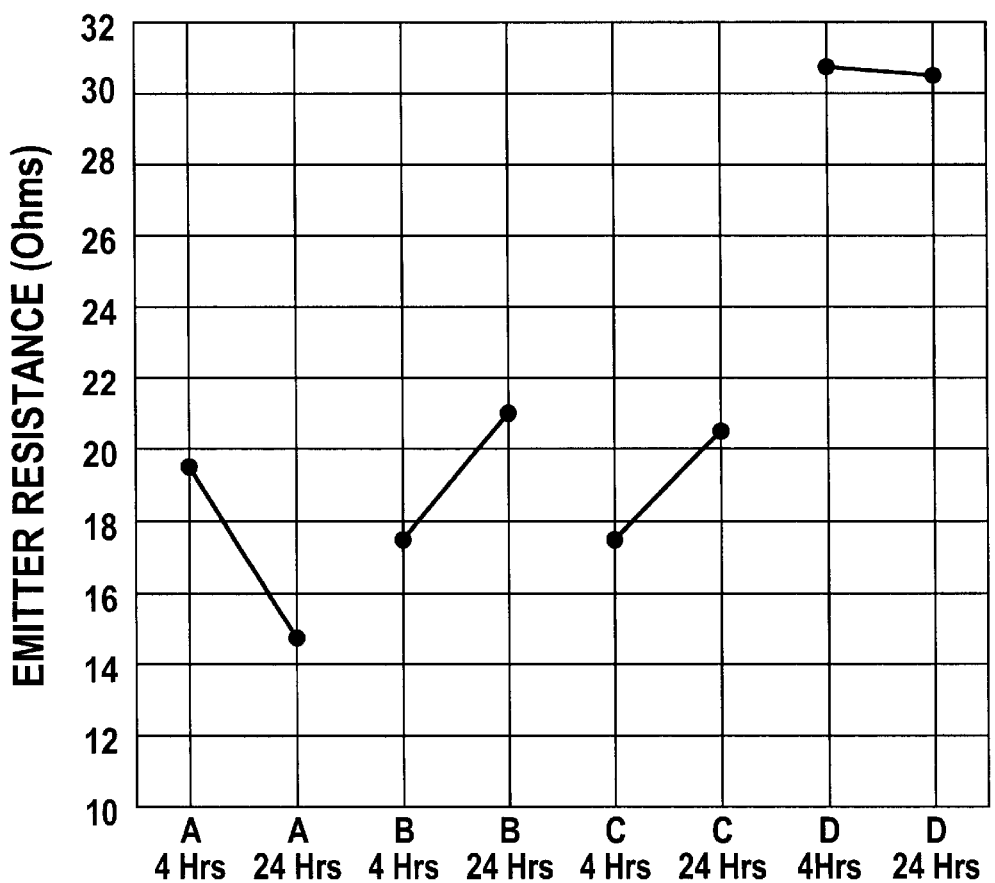
FIG. 9 is a plot of emitter resistance as a function of several of pre-polysilicon cleaning processes and a predetermined delay between the clean and polysilicon deposition.

FIG. 9 is a plot of emitter resistance as a function of several of pre-polysilicon cleaning processes and a predetermined delay between the clean and polysilicon deposition. Emitter resistance measurements were made on devices fabricated with one of four pre-polysilicon cleans where the delay between the clean and polysilicon deposition was either 4 hours or less or at least 24 hours. The fabrication process for these test devices utilized an implanted dopant (arsenic) that resulted in "a retarded" emitter diffusion. An implanted polysilicon process produces emitter resistance measurements that are more accurately a function emitter realignment (which in turn is a function of the thicknesses and continuity of any native oxide layer) than those that would obtained if the test devices were fabricated using a doped polysilicon process.

Clean "A" is the COR clean described above. Clean "B" is a 200:1 HF clean for 30 seconds in a CFM tool, manufactured by Mattson Technology Corp., Fremont Calif. Clean "C" is an anhydrous HF clean for 30 seconds in a Excaliber tool, manufactured by FSI International, Chaska Mn. Clean "D" is a 200:1 HF clean followed by a water rinse for 30 seconds in a CFM tool, manufactured by manufactured by Mattson Technology Corp., Fremont Calif.

Devices fabricated with a 4-hour or less delay and Liz clean "A" (the COR clean) had an emitter resistance of 19.5 ohms. Devices fabricated with a 4-hour delay or less and clean "B" had an emitter resistance of 17.9 ohms. Devices fabricated with a 4-hour or less delay and clean "C" had an emitter resistance of 17.5 ohms. Devices fabricated with a 4-hour or less delay and clean "D" had an emitter resistance of 30.7 ohms. All cleans, except clean "D" produced emitter resistance measurements indicative of emitter realignment after a 4-hour or less delay between the clean and polysilicon deposition. The large resistance for clean "D" is attributable to the water rinse, which is known to produce relative thick (in the order of 10 to 20 Å of native oxide.

Devices fabricated with at least a 24-hour delay and clean "A" (the COR clean) had an emitter resistance of 14.7 ohms. Devices fabricated with at least a 24-hour delay and clean "B" had an emitter resistance of 21.1 ohms. Devices fabricated with at least a 24-hour delay and clean "C" had an emitter resistance of 20.4 ohms. Devices fabricated with at least a 24-hour delay and clean "D" had an emitter resistance of 30.3 ohms. Only clean "A" (the COR clean) produced an emitter resistance measurement indicative of emitter realignment after at least a 24-hour delay between the clean and polysilicon deposition. Cleans "A" (the COR clean), "B" and "C" remove native oxide, but only clean "A" (the COR clean) provides a passivated surface that inhibits native oxide growth on the cleaned surface.

Thus, a method to remove native oxide layers in emitter openings prior to emitter layer deposition and restrict its re-growth for periods in excess of 4 hours has been demonstrated.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a bipolar transistor, comprising:
   forming an emitter opening in a dielectric layer to expose a surface of a base layer;
   performing a clean of said exposed surface, said clean removing any oxide present on said surface and passivating said surface to inhibit oxide growth; and
   forming an emitter layer on said surface after said performing a clean.

2. The method of claim 1, wherein said performing a clean is conducted utilizing a chemical oxide removal process.

3. The method of claim 2, wherein said chemical oxide removal process is conducted in a vapor of HF and $NH_3$.

4. The method of claim 2, wherein said chemical oxide removal process is carried out at a pressure of about 6 millitorr or below.

5. The method of claim 1, wherein said forming an emitter layer utilizes a polysilicon deposition or an epitaxial growth process.

6. The method of claim 1, wherein said forming an emitter layer utilizes a doped polysilicon deposition or a doped epitaxial growth process.

7. The method of claim 6, wherein a dopant of said emitter layer is arsenic.

8. The method of claim 1, wherein said forming an emitter layer is performed at a deposition rate of 100 Å/minute or more.

9. The method of claim 1, wherein said bipolar transistor is a SiGe transistor.

10. The method of claim 1, further including a delay of greater than four hours between said performing a clean of said exposed surface and said forming an emitter layer.

11. The method of claim 1, wherein said forming an emitter layer forms a silicon layer containing arsenic at a concentration of 5E20 to 2E21 atm/cm$^3$.

12. The method of claim 1, wherein said forming an emitter layer forms a realigned silicon layer.

13. A method of fabricating a bipolar transistor comprising;

providing a substrate;

forming a collector in said substrate;

forming a base layer over said collector, said base layer including an intrinsic base region, said intrinsic base region including a SiGe layer;

forming a dielectric layer over said intrinsic base region;

forming an emitter opening in said dielectric layer to expose a surface of said intrinsic base region; and performing a clean of said exposed surface, said clean removing any oxide present on said surface and passivating said surface to inhibit oxide growth; and forming an emitter layer on said surface after said performing a clean.

14. The method of claim 13, wherein said performing a clean is conducted utilizing a chemical oxide removal process.

15. The method of claim 14, wherein said chemical oxide removal process is conducted in a vapor of HF and $NH_3$.

16. The method of claim 14, wherein said chemical oxide removal process is carried out at a pressure of about 6 millitorr or below.

17. The method of claim 13, wherein said forming an emitter layer utilizes a polysilicon deposition or an epitaxial growth process.

18. The method of claim 13, wherein said forming an emitter layer utilizes a doped polysilicon deposition or a doped epitaxial growth process.

19. The method of claim 18, wherein a dopant of said emitter layer is arsenic.

20. The method of claim 13, wherein said forming an emitter layer is performed at a deposition rate of 100 Å/minute or more.

21. The method of claim 13, further including a delay of greater than four hours between said performing a clean of said exposed surface and said forming an emitter layer.

22. The method of claim 13, wherein said forming an emitter layer forms a silicon layer containing arsenic at a concentration of 5E20 to 2E21 atm/cm$^3$.

23. The method of claim 13, wherein said forming: an emitter layer forms a realigned silicon layer.

* * * * *